(12) United States Patent
Ogawa

(10) Patent No.: US 7,820,916 B2
(45) Date of Patent: Oct. 26, 2010

(54) COMPOSITE CERAMIC SUBSTRATE

(75) Inventor: Nobuaki Ogawa, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 447 days.

(21) Appl. No.: 10/596,458

(22) PCT Filed: Jul. 5, 2005

(86) PCT No.: PCT/JP2005/012403

§ 371 (c)(1),
(2), (4) Date: Jun. 14, 2006

(87) PCT Pub. No.: WO2006/027888

PCT Pub. Date: Mar. 16, 2006

(65) Prior Publication Data
US 2008/0283279 A1 Nov. 20, 2008

(30) Foreign Application Priority Data
Sep. 8, 2004 (JP) .............................. 2004-261692

(51) Int. Cl.
*H05K 1/16* (2006.01)
(52) U.S. Cl. ................... 174/260; 174/261; 174/262
(58) Field of Classification Search ............... 174/255, 174/260, 262
See application file for complete search history.

(56) References Cited

U.S. PATENT DOCUMENTS

| 3,483,308 | A | 12/1969 | Wakely |
| 5,107,329 | A | 4/1992 | Okinaga et al. |
| 5,900,738 | A | 5/1999 | Khandros et al. |
| 5,926,951 | A | 7/1999 | Khandros et al. |
| 5,943,212 | A * | 8/1999 | Horiuchi et al. ............ 361/704 |
| 6,184,587 | B1 | 2/2001 | Khandros et al. |
| 6,242,803 | B1 | 6/2001 | Khandros et al. |
| 6,274,823 | B1 | 8/2001 | Khandros et al. |
| 6,279,227 | B1 | 8/2001 | Khandros et al. |
| 6,476,333 | B1 | 11/2002 | Khandros et al. |
| 6,815,810 | B2 * | 11/2004 | Takehara et al. ............ 257/687 |
| 2003/0071350 | A1 | 4/2003 | Takehara et al. |

FOREIGN PATENT DOCUMENTS

| CN | 1412838 A | 4/2003 |
| GB | 1263126 A | 2/1972 |
| JP | 09-083090 A | 3/1997 |
| JP | 09-186042 A | 7/1997 |
| JP | 10-261874 A | 9/1998 |

(Continued)

OTHER PUBLICATIONS

Official communication issued in the counterpart European Application No. 05765475.8, mailed on Apr. 10, 2007.

(Continued)

*Primary Examiner*—Ishwarbhai B Patel
(74) *Attorney, Agent, or Firm*—Keating & Bennett, LLP

(57) ABSTRACT

A composite ceramic substrate includes a ceramic substrate having surface-mounted components mounted thereon, external terminal electrodes connecting wiring patterns disposed on the ceramic substrate and surface electrodes of a motherboard, and a convex leg portion made of resin and arranged such that an end surface supports the external terminal electrodes, and the external terminal electrodes are connected to the wiring patterns via a via-hole conductor provided in the leg portion.

13 Claims, 12 Drawing Sheets

FOREIGN PATENT DOCUMENTS

| | | |
|---|---|---|
| JP | 2000-101348 A | 4/2000 |
| JP | 2003-124435 A | 4/2003 |
| JP | 02004254037 A * | 9/2004 |
| WO | 97/35343 A1 | 9/1997 |

OTHER PUBLICATIONS

International Search Report issued in the corresponding International Application No. PCT/JP2005/012403, mailed on Aug. 16, 2005.

Official communication issued in counterpart Chinese Application No. 2005800017162, mailed on May 9, 2008.

Official communication issued in the counterpart Korean Application No. 10-2006-7012299, mailed on Aug. 14, 2007.

Official Communication issued in corresponding Chinese Patent Application No. 200580001716.2, mailed on Sep. 11, 2009.

* cited by examiner

COMPOSITE CERAMIC SUBSTRATE

BACKGROUND OF THE INVENTION

1. Field of the Invention

The present invention relates to composite ceramic substrates, and more specifically, relates to composite ceramic substrates having built-in circuit elements and having laminated ceramic substrates and resin layers.

2. Description of the Related Art

Conventional technologies in this field include a laminated electronic component disclosed in Japanese Unexamined Patent Application Publication No. 9-186042 (Patent Document 1) and a high-frequency semiconductor device disclosed in Japanese Unexamined Patent Application Publication No. 2003-124435 (Patent Document 2).

The laminated electronic component disclosed in Patent Document 1 is formed by laminating a plurality of insulating sheets so as to interpose a circuit element therebetween and to define a laminate having opposing main surfaces and side surfaces connecting the main surfaces, preparing a plurality of external electrodes on the outer surfaces of the laminate so as to be electrically connected to the circuit element, and forming a recess at least at the central portion of a surface at a circuit board side of the laminate when the laminated electronic component is mounted on the circuit board via the external electrodes. With such a recess formed on the surface at the circuit board (specifically, a flexible printed-circuit board) side of the laminate, even if the circuit board is bent, the bent surface of the printed-circuit board does not come into contact with the surface of the circuit board side of the laminate. Therefore, the pressing-up force against the laminate is avoided. Thus, detachment of the laminate from the printed-circuit board and breakage of the laminate are prevented.

The high-frequency semiconductor device disclosed in Patent Document 2 includes a composite resin material layer provided on the bottom of a ceramic substrate. The composite resin material layer is made of an epoxy resin and an inorganic filler material and has a flat bottom on which electrodes for external connection are provided. Semiconductor elements and passive components, which are connected to the ceramic substrate, are embedded in the inside of the composite resin material layer. With such a structure, the bottom surface of the board can be used as a mounting area to improve the mounting density. Furthermore, mechanical properties and reliability in moisture resistance are improved by embedding the semiconductor elements and the passive components in the composite resin material layer.

The laminated electronic component disclosed in Patent Document 1 avoids the pressing-up force by forming the recess at the central portion. However, the entire laminate bends corresponding to bending of the printed-circuit board. It is not a problem when surface-mounted components are not mounted on the top surface or on both top and bottom surfaces of the laminate. However, when the surface-mounted components, such as passive components and active components, are mounted on the laminate, these surface-mounted components cannot correspond to the bending of the laminate, which may cause disconnection of terminals for external connection of the surface-mounted components from the electrodes on the surface of the laminate. Thus, breaking of the wires may occur.

In the high-frequency semiconductor device disclosed in Patent Document 2, the size of the board component can be decreased by mounting the surface-mounted components, such as active components and passive components, on the bottom or top surface of the ceramic substrate. However, the ceramic substrate also bends corresponding to the bending of the printed-circuit board. Therefore, since the surface-mounted components cannot correspond to the bending of the ceramic substrate, the terminals for external connection of the surface-mounted components are disconnected from the electrodes on the surface of the laminate, which causes breaking of the wires as in the case of the laminated electronic component of Patent Document 1.

SUMMARY OF THE INVENTION

To overcome the problems described above, preferred embodiments of the present invention provide a composite ceramic substrate which prevents breaking of the wires and detachment caused by disconnection of the composite ceramic substrate from a motherboard which arises from bending of the motherboard and, simultaneously, prevents breaking of the wires of the composite ceramic substrate itself and damage to surface-mounted components caused by disconnection between the surface-mounted components and the board.

A composite ceramic substrate according to a first preferred embodiment of the present invention includes a ceramic substrate having a surface-mounted component mounted thereon, an external terminal electrode connecting a wiring pattern provided on the ceramic substrate and a surface electrode of a motherboard, a convex leg portion made of resin such that an end surface supports the external terminal electrode, and a via-hole conductor provided in the leg portion and connecting the external terminal electrode and the wiring pattern.

In a composite ceramic substrate according to a second preferred embodiment of the present invention, the surface-mounted component in the first preferred embodiment of the present invention is mounted on a first main surface and/or a second main surface of the ceramic substrate and the convex leg portion is disposed on the second main surface of the ceramic substrate.

The convex leg portion is preferably disposed at the periphery of the second main surface of the ceramic substrate.

A plurality of the external terminal electrodes is preferably supported by the end surface of a single convex leg portion.

The external terminal electrodes are preferably not disposed at corners of the second main surface of the ceramic substrate.

The corners are preferably lower than the height at which the external terminal electrodes are disposed.

The surface-mounted components mounted on the second main surface are preferably mounted between the convex leg portions.

The surface-mounted component is preferably supported with the same resin from which the convex leg portion is made.

A round portion is preferably provided between the convex leg portion and the resin coating the surface-mounted components.

The surface of the resin coating the surface-mounted components preferably has a slit.

An edge of the convex leg portion preferably has a rounded shape.

The via-hole conductor is preferably made with conductive resin having flexibility.

The ceramic substrate is preferably a multilayer ceramic substrate formed by laminating a plurality of low temperature co-fired ceramic layers.

In a composite ceramic substrate according to preferred embodiments of the present invention, the surface-mounted component preferably includes an array of external terminal electrodes.

According to various preferred embodiments of the present invention described above, a composite ceramic substrate is provided which prevents breaking of the wires or detachment caused by disconnection of the composite ceramic substrate from a motherboard arising from bending of the motherboard and, simultaneously, prevents breaking of the wires of the composite ceramic substrate itself and damage to surface-mounted component caused by disconnection between the surface-mounted component and the board.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1A is a view showing a state after the composite ceramic substrate is mounted on a motherboard, FIG. 1B is a view showing a state when the motherboard after the mounting is bent, and FIG. 1C is a view showing a state of breaking of wire in a conventional composite ceramic substrate.

FIG. 4A is a cross-sectional view of the composite ceramic substrate, and FIG. 4B is a schematic cross-sectional view showing the bonding relationship between a conventional multilayer ceramic substrate and surface-mounted components.

DETAILED DESCRIPTION OF PREFERRED EMBODIMENTS

The present invention will now be described with reference to preferred embodiments shown in FIGS. 1A to 15.

First Preferred Embodiment

Figure 1A:
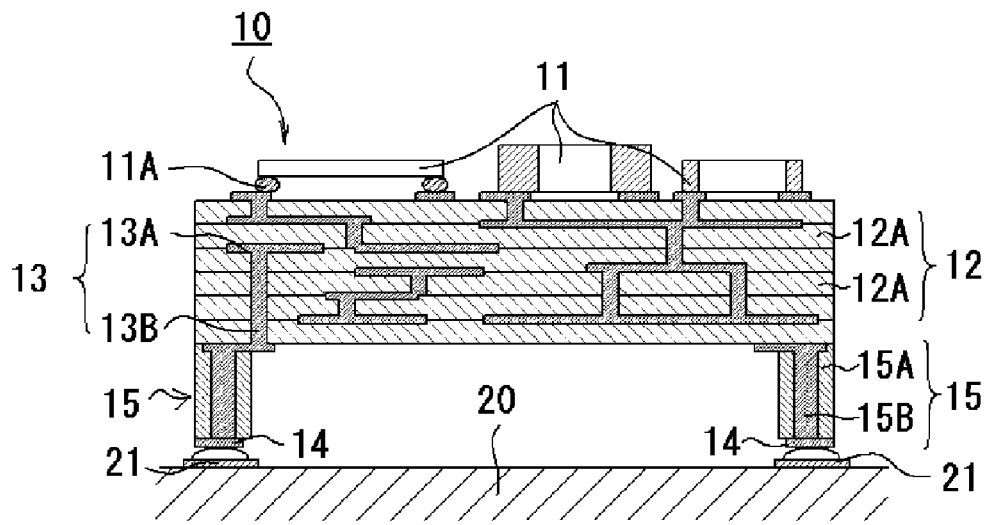
FIGS. 1A to 1C are cross-sectional views of a composite ceramic substrate according to a preferred embodiment of the present invention.
Figure 1B:
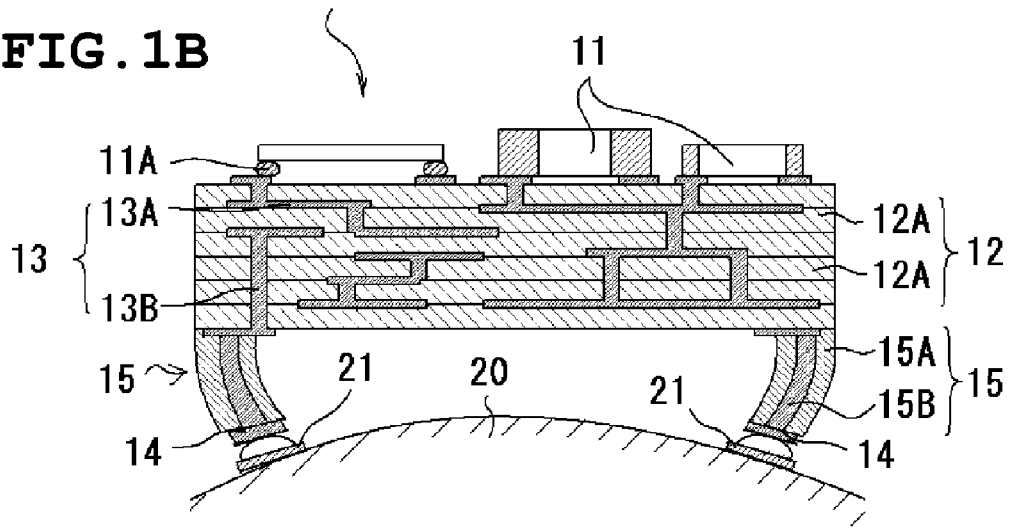

A composite ceramic substrate 10 according to this preferred embodiment, for example, as shown in FIGS. 1A and 1B, includes a ceramic substrate 12 having surface-mounted components 11 mounted thereon, a plurality of external terminal electrodes 14 connecting wiring patterns 13 provided in the ceramic substrate 12 and surface electrodes 21 on a motherboard 20, these external terminal electrodes 14, convex leg portions 15 made of resin so as to support the external terminal electrodes 14 at an end surface, and via-hole conductors 15B provided in the leg portions 15 and connecting the plurality of external terminal electrodes 14 and the wiring patterns 13. The surface-mounted components 11 are mounted on a first main surface (hereinafter referred to as "the top surface") of the ceramic substrate 12, and the external terminal electrodes 14 are disposed at a second main surface (hereinafter referred to as "the bottom surface") side of the ceramic substrate 12.

Examples of the surface-mounted components 11 to be mounted include passive components, such as capacitors, inductors, and resistors and active devices, such as semiconductor elements and gallium arsenide semiconductor elements. These surface-mounted components 11 are mounted on the top surface of the ceramic substrate 12 by connecting with solder or electrically conductive resin 11A or by wiring with, for example, gold, aluminum, or copper wire.

The ceramic substrate 12 may be formed by sintering one ceramic green sheet or may be a multilayer ceramic substrate formed by sintering a laminate of a plurality of ceramic green sheets. Therefore, the multilayer ceramic substrate will be also described with reference number "12". When the ceramic substrate 12 is the multilayer ceramic substrate as shown in FIGS. 1A and 1B, the multilayer ceramic substrate 12 is formed by laminating a plurality of ceramic layers 12A as shown in FIGS. 1A and 1B.

The ceramic substrate 12 is preferably formed by sintering a low temperature co-fired ceramic (LTCC) material. The low temperature co-fired ceramic material is a ceramic material which can be sintered at a temperature of about 1050° C. or less and can be co-sintered with a material having a low specific resistance, such as silver or copper. Examples of the low temperature co-fired ceramic material include glass composite LTCC materials which are a mixture of a borosilicate glass and a ceramic powder of alumina, forsterite, or other suitable materials; crystallized glass LTCC materials of ZnO—MgO—Al$_2$O$_3$—SiO$_2$ crystallized glasses; and glass-free LTCC materials of BaO—Al$_2$O$_3$—SiO$_2$ ceramic powder, Al$_2$O$_3$—CaO—SiO$_2$—MgO—B$_2$O$_3$ ceramic powder, or other suitable materials. The wiring patterns 13 can be formed with metal having a low specific resistance and a low melting point, such as silver or copper, by forming the ceramic substrate 12 with the low temperature co-fired ceramic material. Therefore, the ceramic substrate 12 and the wiring patterns 13 can be co-sintered at a low temperature of about 1050° C. or less.

When the ceramic substrate 12 is the multilayer ceramic substrate 12 as shown in FIGS. 1A and 1B, the wiring patterns 13 disposed in the multilayer ceramic substrate 12 include in-plane conductors 13A formed along the surfaces of the ceramic layers 12A and via-hole conductors 13B connecting the upper and lower in-plane conductors 13A as shown in FIG. 1A. The in-plane conductors 13A, of the wiring patterns 13, disposed on both top and bottom surfaces of the multilayer ceramic substrate 12 are formed as surface electrodes 13A. The wiring patterns 13 preferably include electrically conductive metal, such as silver or copper, as the main component, and the in-plane conductors 13A and the via-hole conductors 13B may be made of the same metal material or may be made of different metal material.

With reference to FIGS. 1A and 1B, the external terminal electrodes 14 are disposed on protruding ends (bonding plane of the motherboard 20 and the surface electrodes 21) of the leg portions 15 which are formed so as to protrude from the bottom surface of the multilayer ceramic substrate 12. The leg portions 15 each include a resin portion 15A and the via-hole conductor 15B passing through the resin portion 15A, and are formed, for example, at a plurality locations of the periphery of the multilayer ceramic substrate 12. The via-hole conductors 15B electrically connect the surface electrodes (in-plane conductors) 13A disposed on the bottom surface of the multilayer ceramic substrate 12 and the external terminal electrodes 14. The external terminal electrodes 14 for connecting the wiring patterns 13 of the multilayer ceramic substrate 12 and the surface electrodes 21 of the motherboard 20 may be made of metal foil as described below. Alternatively, the end surfaces of the via-hole conductors 15B in the leg portions 15 can be directly used as the external terminal electrodes. Additionally, the via-hole conductors 15B may be directly connected to the via-hole conductors 13B of the multilayer ceramic substrate 12.

The external terminal electrodes 14 are preferably made of metal foil, such as copper. The external terminal electrodes 14 having a low resistance can be formed at low cost by forming the external terminal electrodes 14 with the metal foil. Additionally, the external terminal electrodes 14 can be bonded to the leg portions 15 more tightly by roughening the resin-side surface of the external terminal electrodes 14. The external terminal electrodes 14 cannot be sintered because they are disposed at the resin layer side, i.e., in the leg portions 15 made of composite resin, and a combination of copper foil and resin can be prepared by a method for manufacturing printed wiring board. For these reasons, the external terminal electrodes 14 are made of metal foil, such as copper foil, instead of thick film electrodes.

The resin portions 15A of the leg portions 15 are preferably made of, but are not limited to, a composite resin material which is a mixture of a resin material and an inorganic filler. Examples of the resin material include, but are not limited to, a thermosetting resin and photosetting resin. Preferably, the thermosetting resin, such as an epoxy resin, a phenolic resin, and a cyanate resin is used. With respect to the inorganic filler, since metal powder has electrical conductivity and may harm the insulation of the resin portions, materials having electrical insulation, for example, Al$_2$O$_3$, SiO$_2$, and TiO$_2$, are preferably used, but are not limited to these.

The via-hole conductors 15B of the leg portions 15 preferably have flexibility so as to be bent corresponding to the bending of the resin portions 15A, and are preferably made with, for example, solder or electrically conductive resin. Examples of the electrically conductive resin include, but are not limited to, mixtures of metal particles of gold, silver, copper, nickel, or the like and a thermosetting resin such as an epoxy resin, a phenolic resin, and a cyanate resin. The thickness (height) of the leg portions 15 depends on the area of the multilayer ceramic substrate 12 and the type of the resin material, but is preferably about 30 μm to about 500 μm, and more preferably about 30 μm to about 300 μm, such that the bending of the motherboard 20 will not influence the multilayer ceramic substrate 12 and the strength of the leg portions 15 themselves is maintained.

The composite ceramic substrate of this preferred embodiment can be manufactured as described below. The manufacturing processes of the composite ceramic substrate are schematically shown in FIG. 2A to 2E.

(1) Preparation of Ceramic Green Sheet

In this preferred embodiment, first, for example, about 55 w/t parts of alumina particles having a mean particle size of about 1.0 μm and about 45 w/t parts of borosilicate glass having a mean particle size of about 1.0 μm and a softening point of about 600° C. are mixed, and then, to the resulting mixture, an organic solvent, a dispersant, an organic binder, and a plasticizer are added to prepare a slurry. Then, the slurry is applied to a carrier film of a polyethylene terephthalate resin to prepare a ceramic green sheet of a low temperature co-fired ceramic material having a thickness of about 10 μm to about 200 μm.

Then, via-holes having a diameter of about 0.1 mm are formed in the ceramic green sheet by laser machining or punching, and then the ceramic green sheet is adhered on a flat and smooth supporting table. An electrically conductive paste is prepared by kneading metal powder primarily composed of silver powder or copper powder, a thermosetting resin, and an organic solvent. The electrically conductive paste is compressed into openings for via-hole conductors of the ceramic green sheet adhered on the supporting table from the carrier film side with a squeegee while scraping the excess electrically conductive paste. Thus, via-hole layers for via-hole conductors are formed. In this case, the via-holes can be completely filled with the electrode paste by reducing the pressure in the via-holes using an aspirating mechanism set on the supporting table. Predetermined patterns of electrically conductive paste are printed on the respective ceramic green sheets by screen printing. After drying, printed paste layers and conductive paste layers to be in-plane conductors and via-hole conductors are formed as wiring pattern layers.

(2) Preparation of Ceramic Multilayer Board

Figure 2A:
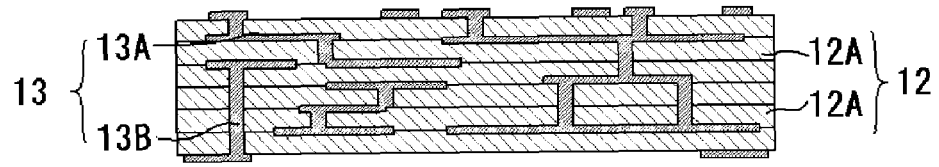
FIGS. 2A to 2E are process drawings showing substantial portions of manufacturing of the composite ceramic substrate shown in FIG. 1.

The ceramic green sheets, on which the wiring pattern layers are formed, are laminated in predetermined order to prepare a laminate and then are press-bonded at a pressure of about 0.1 MPa to about 1.5 MPa at a temperature of about 40° C. to about 100° C. to prepare a green laminate. After removing the binder from the green laminate, the laminate is sintered in air at about 850° C. when the wiring pattern layer is a silver base and is sintered in a nitrogen atmosphere at about 950° C. when the wiring pattern layer is a copper base. Thus, a multilayer ceramic substrate 12 shown in FIG. 2A is prepared. Then, films of Ni/Sn, Ni/Au, or other suitable materials are formed on the upper and lower electrodes by wet plating, if necessary.

(3) Preparation of External Terminal Electrode

Figure 2B:

The external terminal electrodes 14 to be mounted may be prepared by processing copper foil by a known etching method. Namely, copper foil having a thickness of about 10 μm to about 40 μm is adhered to a carrier film, and patterning of the copper foil by photoresist coating, exposure, development, etching, and removing of the resist film is performed. Thus, the external terminal electrodes 14 shown in FIG. 2B are prepared.

(4) Preparation of Resin Sheet for Leg Portion

A resin sheet for the leg portions 15 is prepared. Namely, a composite resin material mixture of a thermosetting resin, such as an epoxy resin, a phenolic resin, and a cyanate resin and an inorganic filler, such as $Al_2O_3$, $SiO_2$, and $TiO_2$ is formed into a sheet on a carrier film by doctor blade method to prepare a resin sheet 15"A of semi-cured state (B-stage) shown in FIG. 2C. In this case, the cross-linking reaction of the epoxy thermosetting resin is enhanced by thermally treating these materials and the viscosity is adjusted such that the epoxy thermosetting resin on the carrier film will not flow. Optimum time for the thermal treatment depends on characteristics of the thermosetting resin.

(5) Preparation of Leg Portion

Figure 2C:
Figure 2D:
Figure 2D:

Via-holes are formed in predetermined portions of the resin sheet 15"A using laser beams, and then, as shown in FIG. 2C, the via-holes are filled with the via-hole conductors 15B of solder or electrically conductive resin. After the preparation of a predetermined number of the resin sheets 15"A, each of the resin sheets 15"A is processed into a desired shape (the shape of the leg portion) by laser machining or punching (see FIG. 2D). Then, leg portions 15 having a desired film thickness are prepared by stacking a desired number of the resin sheets 15"A. In this case, the laser machining or punching may be performed after the stacking of the desired number of the resin sheet 15"A. When the solder is used as the via-hole conductors 15B, a reflow process is performed for bonding the solder to the in-plane conductors 12A on the bottom surface of the multilayer ceramic substrate 12 and to the external terminal electrodes 14. In other words, the reflow process may be performed after the lamination of the leg portions 15 to the multilayer ceramic substrate 12, or the reflow process may be performed after the mounting of surface-mounted components such that etching and bonding can be simultaneously performed during the reflow process after the mounting of the surface-mounted components.

(6) Preparation of Composite Ceramic Substrate

Figure 2E:
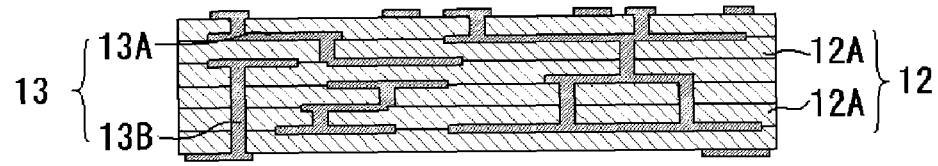
Figure 2E:
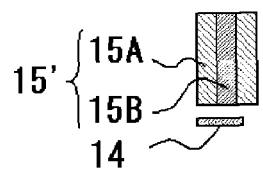
Figure 2E:
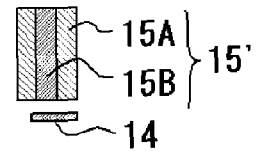

As shown in FIG. 2E, the external terminal electrodes 14, the leg portions 15, and multilayer ceramic substrate 12 are arranged in this order from the bottom to the top, and then lamination process of laminating, heating, and pressurizing is performed. Specifically, the composite ceramic substrate 10 shown in FIG. 1A is manufactured by adhering the leg portions 15 to the bottom surface of the multilayer ceramic substrate 12, and further adhering the external terminal electrodes 14 to the bottom surfaces of the leg portions 15. In this case, the multilayer ceramic substrate 12, the leg portions 15, and the external terminal electrodes 14 are press-bonded by cold isostatic pressing so that the leg portions 15 are securely bonded to the multilayer ceramic substrate 12 while maintaining the shape of the leg portions 15. Main curing of the leg portions 15 and the resin portions 15A can be performed by heating the united composite ceramic substrate 12 and the leg portions 15, for example, at about 170° C. for about one hour. Then, the surface-mounted components 11 are mounted on the top surface of the multilayer ceramic substrate 12 by using solder or conductive resin. Thus, the composite ceramic substrate 10 of this preferred embodiment can be manufactured as a module component. The external terminal electrodes 14 of the composite ceramic substrate 10 are configured to have a land grid array (LGA) structure (see FIG. 7) which does not have solder filler when they are mounted.

For example, a thickness of the leg portions 15, i.e., a protrusion size from the multilayer ceramic substrate 12, satisfactory for achieving its function is about 50 μm when the multilayer ceramic substrate 12 is about 10 square mm. The protrusion size of the leg portions 15 must be changed according to a change in the size of the multilayer ceramic substrate 12. When the size of the multilayer ceramic substrate 12 is small, the protrusion size may be small. Conversely, when the size of the multilayer ceramic substrate 12 is large, the protrusion size may be large. The leg portions 15 are preferably formed along the periphery of the bottom surface of the multilayer ceramic substrate 12. The forming of the leg portions 15 along the periphery of the bottom surface of the multilayer ceramic substrate 12 stabilizes the mounting to the motherboard 20, which improves the reliability thereof.

Figure 3A:
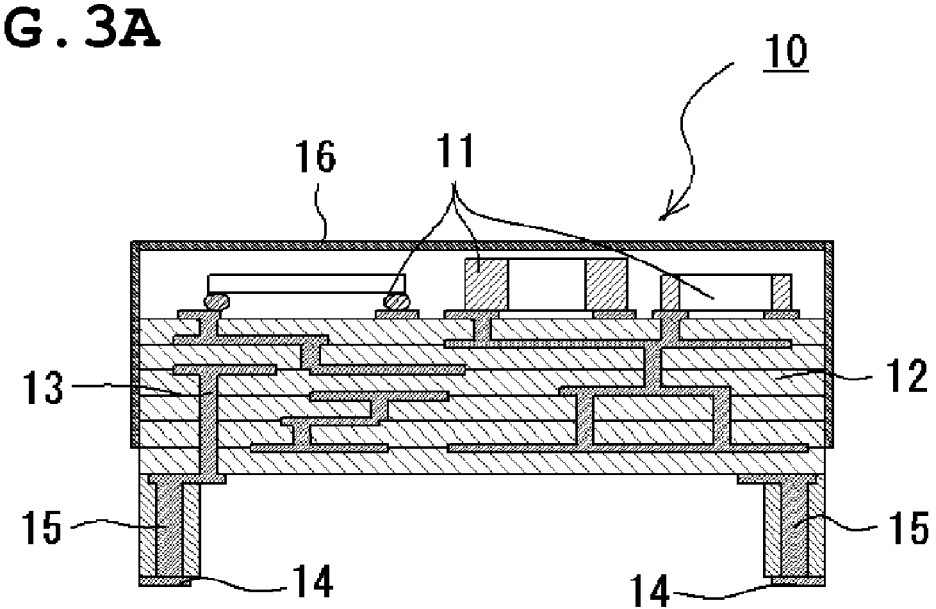
FIGS. 3A and 3B are cross-sectional views of a composite ceramic substrate according to another preferred embodiment of the present invention.

When the composite ceramic substrate 10 of this preferred embodiment is mounted on the motherboard 20 with a mounter, as shown in FIG. 3A, it is preferable that the surface-mounted components 11 on the top surface of the composite ceramic substrate 10 are previously covered with a case 16 so that the composite ceramic substrate 10 can be readily handled by the mounter. Examples of the case 16 include, but are not limited to, metal materials such as white metal and phosphor bronze.

Figure 3B:
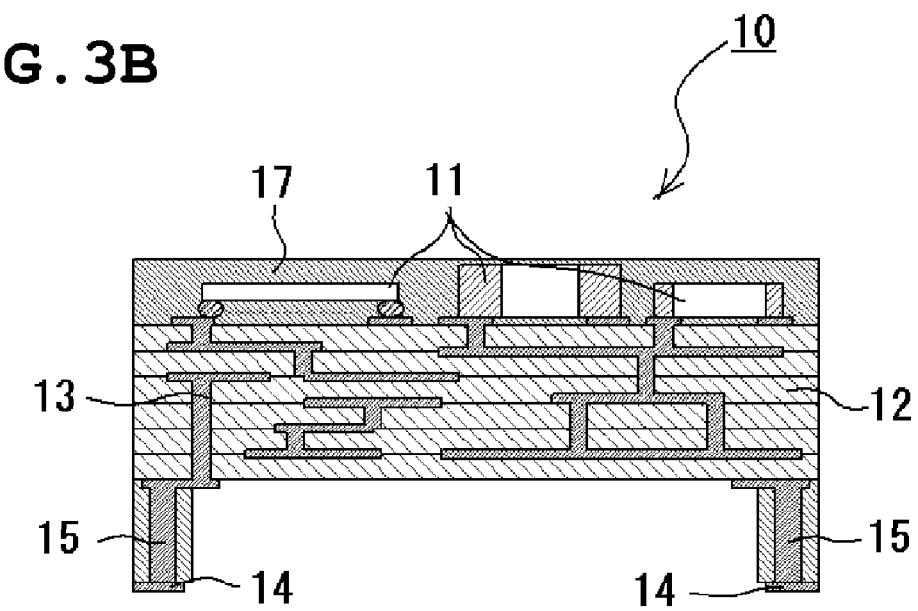

In order to achieve a similar purpose, as shown in FIG. 3B, the entire top surface of the composite ceramic substrate 10 may be coated with a composite resin material including a thermosetting resin as a main component so that a resin layer 17 coats the surface-mounted components 11. In this instance, it is preferable that the thermal expansion coefficient of the resin layer 17 to be used is substantially the same as that of the resin portions 15A forming the leg portions 15. With this, warpage and cracking of the composite ceramic substrate 10 itself during the thermal treatment such as a reflow process is prevented. Therefore, as mentioned above, the resin layer 17 is preferably formed by the same composite resin material as that forming the resin portions 15A of the leg portions 15, instead of the thermosetting resin alone. The forming of the resin portions 15A of the leg portions 15 and the resin layer 17 by the same composite resin material also prevents warpage and cracking of the composite ceramic substrate 10 itself.

As shown in FIG. 1A, the composite ceramic substrate 10 is mounted on the motherboard 20 such as a printed wiring board as a module component using the mounter. The composite ceramic substrate 10 is electrically connected to the surface electrodes 21 of the motherboard 20 via the external terminal electrodes 14. Since the leg portions 15 have flexibility, even if the motherboard 20 is bent as shown in FIG. 1B, the leg portions 15 bend corresponding to the bending of the motherboard 20 as shown by the drawing to prevent the multilayer ceramic substrate 12 from deforming. Therefore, unlike the conventional way, the multilayer ceramic substrate 12 is not damaged. Furthermore, breaking of the wires or detachment caused by partial disconnection of the surface-mounted components 11 from the multilayer ceramic substrate 12 shown in FIG. 1C does not occur.

Figure 1C:
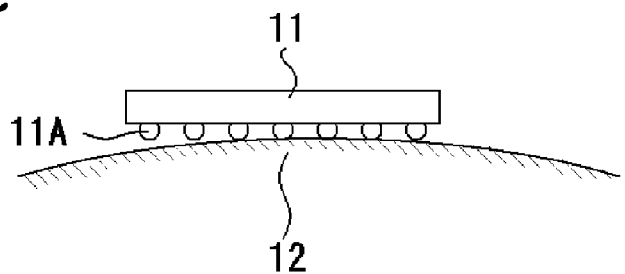

As described above, according to this preferred embodiment, the composite ceramic substrate 10 includes the multilayer ceramic substrate 12 and the surface-mounted components 11 mounted thereon, the external terminal electrodes 14 connecting the wiring patterns 13 in the multilayer ceramic substrate 12 and the surface electrodes 21 on the motherboard 20, the convex leg portions 15 formed with a composite resin material so as to support the external terminal electrodes 14 at an end surface, and via-hole conductors 15B formed in the leg portions 15 and connecting the external terminal electrodes 14 and the wiring patterns 13. Therefore, when the motherboard 20 is bent as shown in of FIG. 1B, the leg portions 15 bend corresponding to the bending of the motherboard 20 to prevent the multilayer ceramic substrate 12 from bending. With this, breaking of the wires caused by disconnection of the composite ceramic substrate 10 from the motherboard 20, breaking of the wires caused by disconnection of the surface-mounted components 11 from the multilayer ceramic substrate 12 as shown in FIG. 1C, and damage of the surface-mounted components 11 themselves are prevented. Thus, the reliability is greatly improved.

Second Preferred Embodiment

Figure 4A:
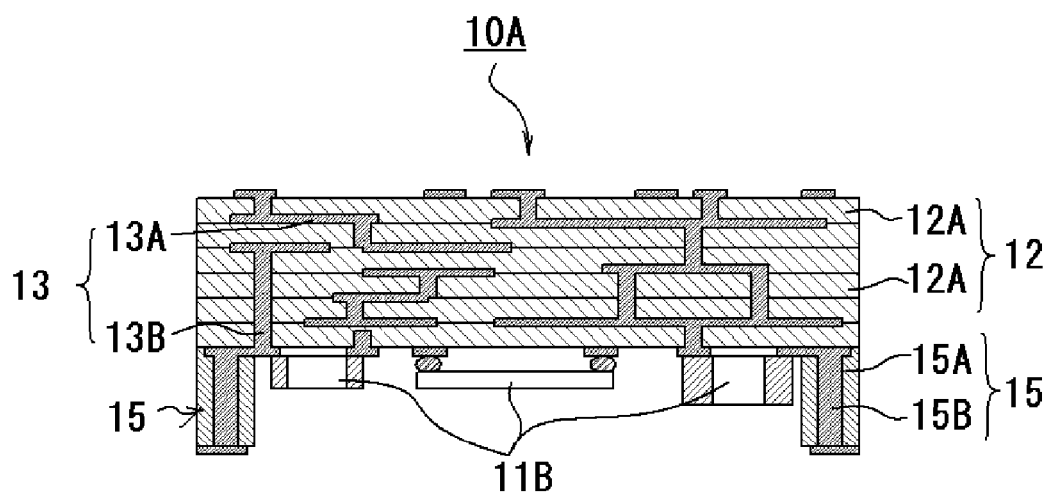
FIGS. 4A and 4B are cross-sectional views of a composite ceramic substrate according to another preferred embodiment of the present invention.
Figure 4B:
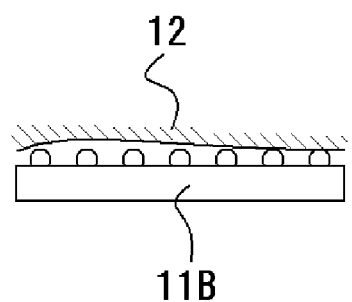

A composite ceramic substrate 10A, for example, as shown in FIG. 4A, of this preferred embodiment is similar to the composite ceramic substrate 10 of the first preferred embodiment except that the surface-mounted components 11B are mounted only on the bottom surface of the multilayer ceramic substrate 12, which is different from the composite ceramic substrate 10 of the first preferred embodiment.

In manufacturing of the composite ceramic substrate 10A of this preferred embodiment, the multilayer ceramic substrate 12 is prepared as in the first preferred embodiment, and then the surface-mounted components 11B are mounted on the bottom surface of the multilayer ceramic substrate 12. Then, the leg portions 15 and the external terminal electrodes 14 are prepared as in the first preferred embodiment and are attached to the multilayer ceramic substrate 12 so as to be arranged at the outer side of the surface-mounted components 11. Thus, the composite ceramic substrate 10A is manufactured.

In this preferred embodiment, the surface-mounted components 11B are mounted on the bottom surface of the multilayer ceramic substrate 12 as in the leg portions 15, so the leg portions 15 are formed so as to protrude further downward than a surface-mounted component 11B having the largest protrusion size (thickness).

Therefore, in this preferred embodiment, since the space between the leg portions 15 of the multilayer ceramic substrate 12 is effectively used for mounting the surface-mounted components 11B, the composite ceramic substrate 10A can be decreased in size and height while achieving the same functions and advantageous effects as those in the first preferred embodiment. The leg portions 15 can bend corresponding to the bending of the motherboard 20 to prevent the multilayer ceramic substrate 12 from being bent even if the motherboard 20 is bent. With this, breaking of the wires caused by disconnection, shown in FIG. 4B, of the surface-mounted components 11B from the multilayer ceramic substrate 12 and damage to the surface-mounted components 11B themselves are prevented. Thus, the reliability is greatly improved.

Third Preferred Embodiment

Figure 5:
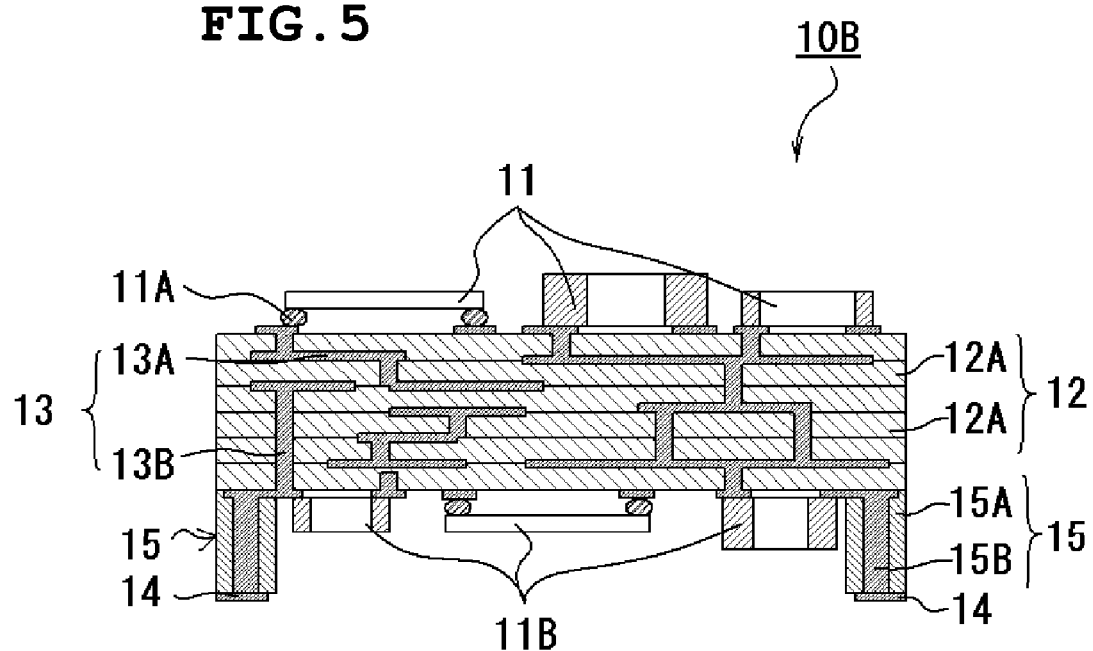
FIG. 5 is a cross-sectional view of a composite ceramic substrate according to another preferred embodiment of the present invention.

A composite ceramic substrate 10B, for example, as shown in FIG. 5, of this preferred embodiment is similar to the composite ceramic substrate 10A of the second preferred embodiment except that the surface-mounted components 11 are mounted on the top surface in addition to the bottom surface of the multilayer ceramic substrate 12.

In manufacturing of the composite ceramic substrate 10B of this preferred embodiment, the surface-mounted components 11B are mounted on the bottom surface of the multilayer ceramic substrate 12 as in the second preferred embodiment, and then the leg portions 15 and the external terminal electrodes 14 are prepared as in the first and second preferred embodiments and are attached to the multilayer ceramic substrate 12 so as to be arranged at the outer side of the surface-mounted components 11B. Then, the surface-mounted components 11 are mounted on the top surface of the multilayer ceramic substrate 12 as in the first preferred embodiment. Thus, the composite ceramic substrate 10B is manufactured. In this case, the surface-mounted components 11 and 11A on the top and bottom surfaces of the multilayer ceramic substrate 12 can be suitably selected according to required functions and be mounted.

Therefore, in this preferred embodiment, since the surface-mounted components 11 are mounted on the top surface of the multilayer ceramic substrate 12 and the space between the leg portions 15 of the multilayer ceramic substrate 12 is effectively used for mounting the surface-mounted components 11B, the same functions and advantageous effects as those in the first and second preferred embodiments are achieved, and additionally, advanced capabilities through further high-density mounting are realized.

Fourth Preferred Embodiment

Figure 6A:
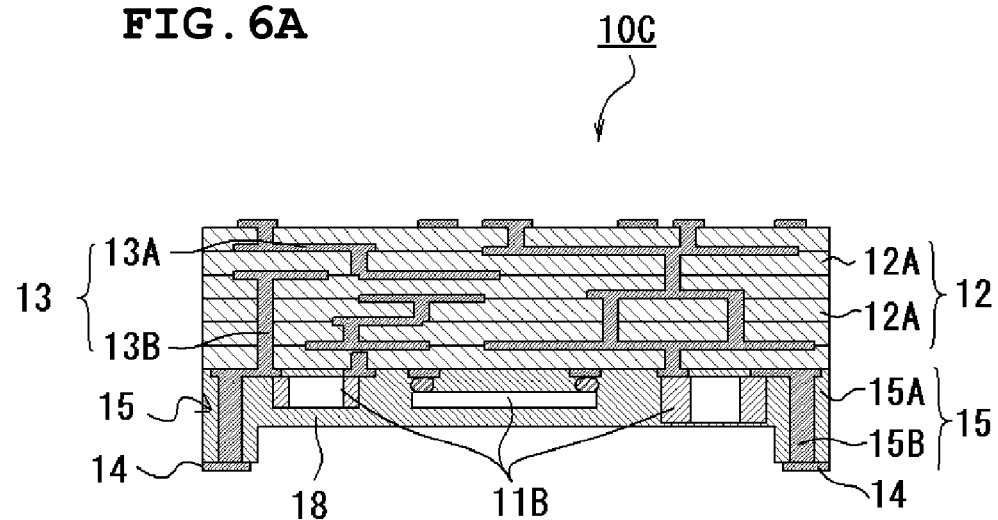
FIGS. 6A and 6B are cross-sectional views of a composite ceramic substrate according to another preferred embodiment of the present invention, and portions (c) and (d) are enlarged cross-sectional views showing portions defined by circles of FIG. 6B.
Figure 6B:
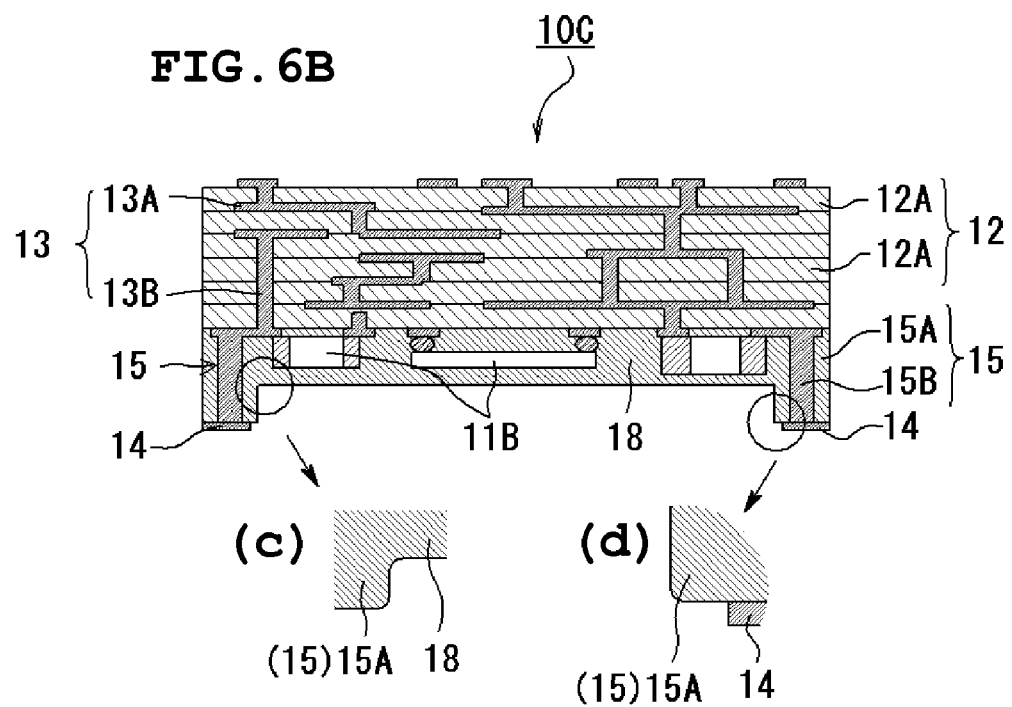

A composite ceramic substrate 10C, for example, as shown in FIGS. 6A and 6B, of this preferred embodiment is similar to the composite ceramic substrate 10A of the second preferred embodiment except that the surface-mounted components 11B mounted on the bottom surface of the multilayer ceramic substrate 12 of the second preferred embodiment are coated with a composite resin layer 18.

In manufacturing of the composite ceramic substrate 10C of this preferred embodiment, the surface-mounted components 11B are mounted on the bottom surface of the multilayer ceramic substrate 12 as in the second preferred embodiment, and then the composite resin layer 18, the leg portions 15, and the external terminal electrodes 14 are attached to the multilayer ceramic substrate 12. These three components 14, 15, and 18 can be attached by, for example, the two methods describe below.

In a first method, after the lamination of the composite resin layer 18, the leg portions 15 are laminated. More specifically, resin sheets having the via-hole conductors 15B are prepared as in the first preferred embodiment. A plurality of resin sheets is stacked so as to have a thickness that is sufficient for embedding the surface-mounted components 11B. Then, after the stacking of the resin sheets, these laminated resin sheets and the multilayer ceramic substrate 12 are arranged so that the laminated resin sheets are laminated on the multilayer ceramic substrate 12 to embed the surface-mounted components 11B. Thus, the composite resin layer 18 is formed. Then, the external terminal electrodes 14 and the leg portions 15, which are prepared as in the first preferred embodiment, are arranged to the multilayer ceramic substrate 12 so as to be laminated to the composite resin layer 18 of the multilayer ceramic substrate 12 as in the first preferred embodiment. The leg portions 15 are press-bonded to the periphery of the composite resin layer 18 by cold isostatic pressing, and then main curing of the composite resin layer 18 and the resin portions 15A of the leg portions 15 are performed. Thus, the composite ceramic substrate 10C is manufactured.

In a second method, the composite resin layer 18 and the leg portions 15 are simultaneously formed. More specifically, copper foil defining the external terminal electrodes 14 and the laminated resin sheets are arranged with respect to the multilayer ceramic substrate 12, and then both components are laminated to the bottom surface of the multilayer ceramic substrate 12 so that the surface-mounted components 11B are embedded in the laminated resin sheets. Thus, the resin layer is formed. Then, the resin layer is pressed from the bottom surface using a metal mold having a convex shape so that the composite resin layer 18 is formed into a concave shape and, simultaneously, the leg portions 15 are formed into a convex shape. Then, main curing of the composite resin layer 18 and the resin portions 15A of the leg portions 15 are performed. Thus, the composite ceramic substrate 10C is manufactured.

In this preferred embodiment, a composite resin material for defining each of the leg portions 15 and the composite resin layer 18 is maintained in a good fluid state when the leg portions 15 and the composite resin layer 18 are formed. A smooth round portion is formed at a portion (c) shown by a circle in FIG. 6B, i.e., at the boundary of the composite resin layer 18 and the leg portion 15, when the composite resin material cures. Additionally, smooth round portions are also formed at a portion (d) shown by a circle in FIG. 6B, i.e., at the edge of the leg portion 15, and at other edges when the composite resin material cures.

Figure 7A:
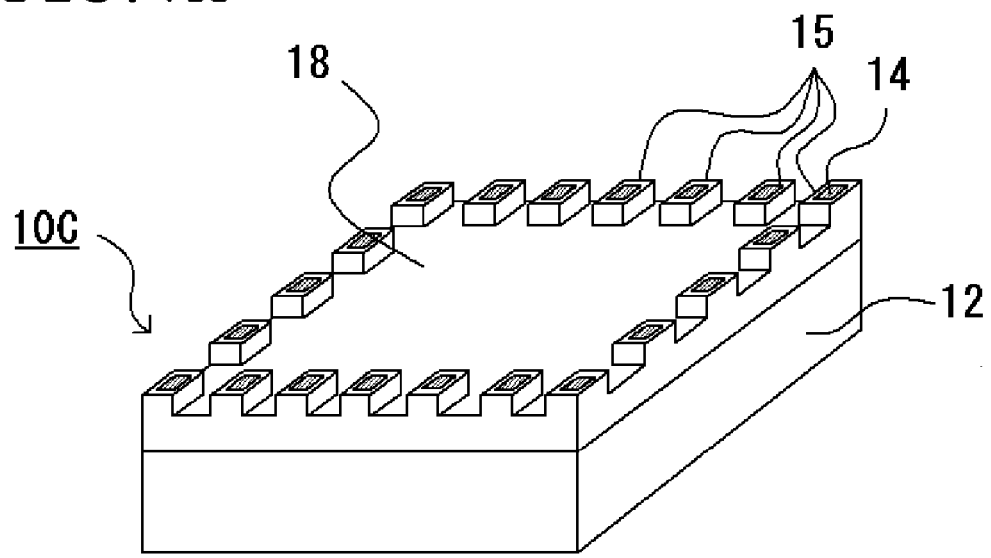
FIGS. 7A and 7B are perspective views from the motherboard side of the composite ceramic substrate shown in FIG. 6A.
Figure 7B:
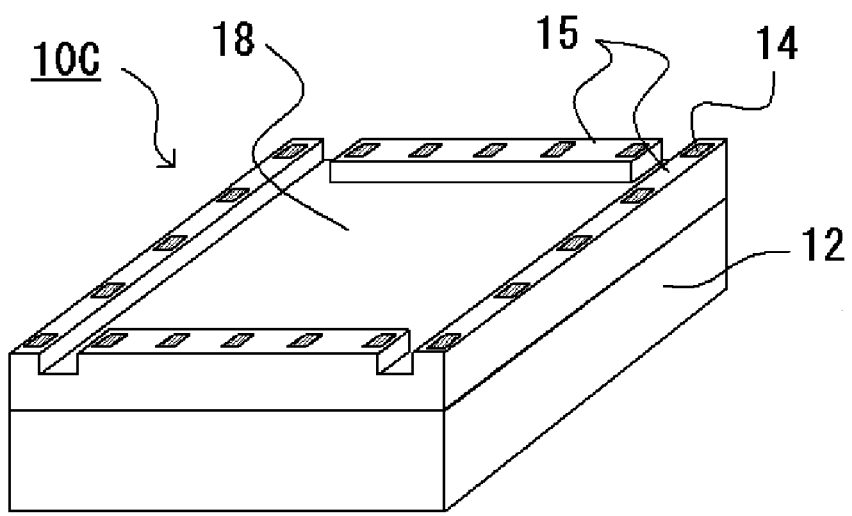

The leg portions 15 in this preferred embodiment are formed at the periphery of the composite resin layer 18, for example, as shown in FIGS. 7A and 7B. The leg portions 15 shown in FIG. 7A are arranged at predetermined intervals along the entire periphery of the composite resin layer 18, and each bottom surface of the leg portions 15 supports the respective external terminal electrodes 14. The leg portions 15 shown in FIG. 7B have first portions formed in an elongated shape along the entire length of two edges opposing to each other of the composite resin layer 18 and second portions formed along the remaining two edges so as to have gaps from both ends of the first portions. The first and second portions support the external terminal electrodes 14 arranged at predetermined intervals.

Therefore, according to this preferred embodiment, the surface-mounted components 11B mounted on the bottom surface of the multilayer ceramic substrate 12 are protected by the composite resin layer 18. Simultaneously, the leg portions 15 are formed and protrude at the periphery of the composite resin layer 18. Therefore, detachment of the surface-mounted components 11B from the multilayer ceramic substrate 12 is more reliably prevented. Additionally, influences by the bending of the motherboard are absorbed by the leg portions 15 and disconnection of the surface-mounted components 11B is more reliably prevented, as compared to when the composite ceramic substrate is merely mounted on the motherboard via the composite resin layer. Thus, reliability is further improved.

According to this preferred embodiment, since the boundaries of the composite resin layer 18 and the leg portions 15 have a smooth round portion (see portion (c) of FIG. 6B), stress concentration at the boundaries is prevented. Consequently, occurrences of cracking are prevented so as to improve the reliability. Since the corners (see portion (d) of FIG. 6B) of the leg portions 15 and other corners also have a smooth round portion, occurrences of chipping are prevented to further improve the reliability.

Furthermore, according to this preferred embodiment, since the leg portions 15 are formed at the periphery of the composite resin layer 18, even if the surface-mounted components 11B embedded in the composite resin layer 18 are partially exposed, the exposed portions do not come into contact with the exterior during mounting of the composite ceramic substrate on the motherboard or during handled. Consequently, breakage of the surface-mounted components 11B is prevented so as to further improve the reliability.

Fifth Preferred Embodiment

Figure 8A:
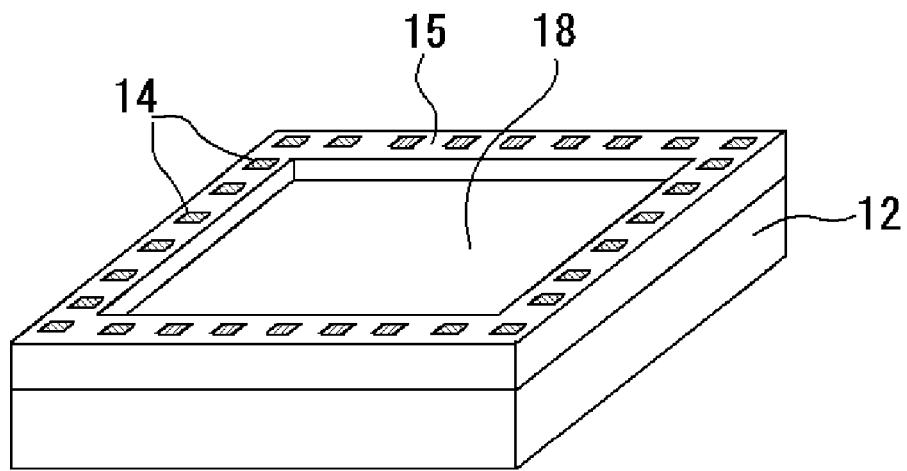
FIGS. 8A and 8B are perspective views from the motherboard side of a modified example of the leg portions of the composite ceramic substrate shown in FIG. 6A.
Figure 8B:
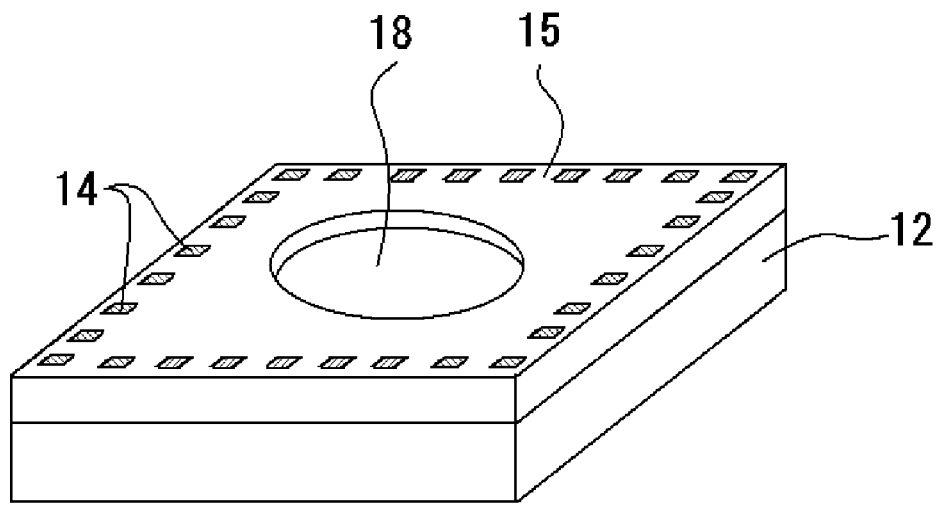

In this preferred embodiment, as shown in FIGS. 8A and 8B, since the composite ceramic substrate is similar to the fourth preferred embodiment except that shapes of the leg portions 15 are different, only characteristic features of this preferred embodiment will be described with the same reference numbers as those in the fourth preferred embodiment for the same or equivalent features. In this preferred embodiment, the leg portion 15 shown in FIG. 8A is formed by integrally projecting the entire periphery of the composite resin layer 18 in a rectangular frame shape, and the leg portion 15 supports a plurality of external terminal electrodes 14 arranged at predetermined intervals on the entire circumference of its bottom surface. Therefore, in the inside of the leg portion 15 of the rectangular frame shape, a rectangular recess is formed as the bottom surface of the composite resin layer 18. This rectangular recess may be formed, for example, as shown in FIG. 8B, as a circular recess. These leg portions 15 are preferably formed by the same process in the fourth preferred embodiment. This preferred embodiment achieves the same functions and advantageous effects as the fourth preferred embodiment.

The rectangular frame-shaped leg portion 15 shown in FIG. 8A can be applied to the composite ceramic substrates shown in FIG. 1, FIG. 3, FIGS. 4A and 4B, and FIG. 5. In such cases, the composite resin layer 18 is not formed in the inside of the leg portion 15, and the bottom surface of the multilayer ceramic substrate 12 and the surface-mounted components 11B are exposed.

Sixth Preferred Embodiment

Figure 9A:
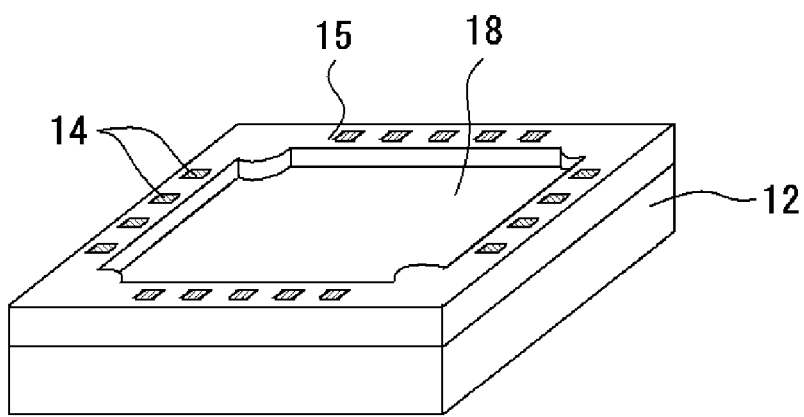
FIGS. 9A and 9B are perspective views from the motherboard side of a modified example of the leg portions and the external terminal electrodes of the composite ceramic substrate shown in FIG. 6A.
Figure 9B:
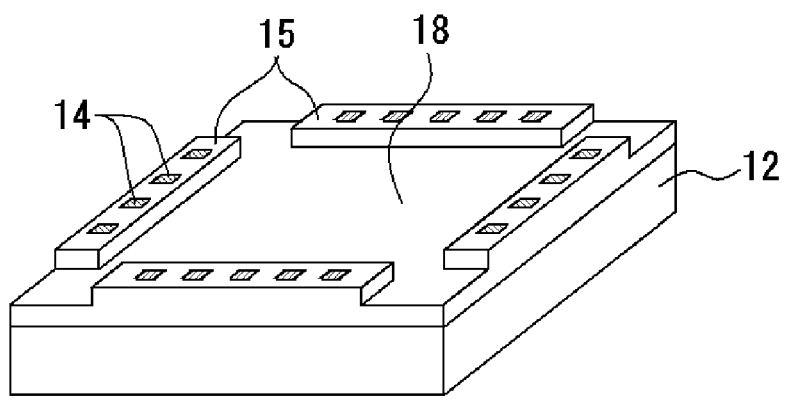
Figure 10:
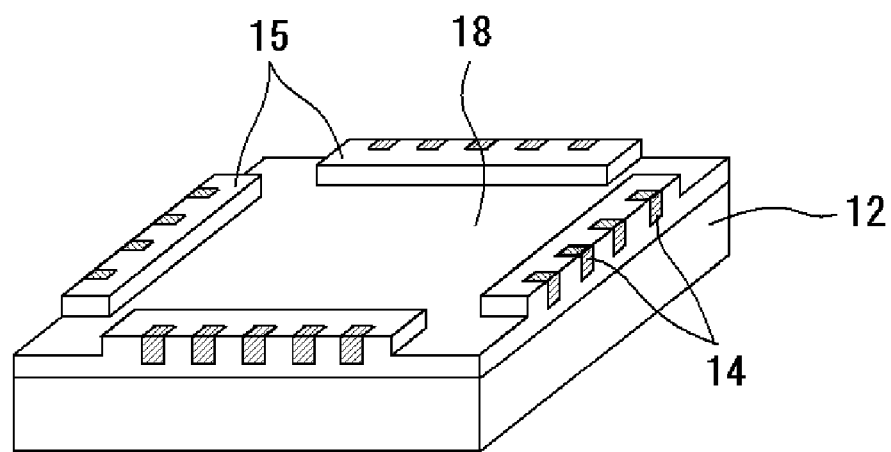
FIG. 10 is a perspective view from the motherboard side of a modified example of the leg portions and the external terminal electrodes of the composite ceramic substrate shown in FIG. 6A.

In this preferred embodiment, as shown in FIGS. 9A and 9B, since the composite ceramic substrate is similar to the fifth preferred embodiment except that a shape of the leg portion 15 and arrangement of the external terminal electrodes 14 are different, only characteristic features of this preferred embodiment will be described with the same reference numbers as those in the fifth preferred embodiment for the same or equivalent features. The leg portion 15 shown in FIG. 9A is substantially the same as that shown in FIG. 8A. The leg portion 15 supports a plurality of external terminal electrodes 14 at portions other than the corners. Therefore, the external terminal electrodes 14 are not disposed at the corners. With this structure, impact resistance of the composite ceramic substrate mounted on a mount board such as a motherboard is improved.

In other words, if the mount board on which the composite ceramic substrate is mounted receives an impact caused, for example, by a fall, the impact causes complicated flexure in the mount board and the stress caused by the flexure is transmitted to the leg portion 15 via the external terminal electrodes 14. At the leg portion 15, the stress transmitted by each of the external terminal electrodes 14 tends to be concentrated at each corner (point where straight lines intersect with each other, each of the straight lines running through the centers of the external terminal electrodes 14 arranged in lines that are substantially perpendicular to each other) via the leg portion 15. However, in this preferred embodiment, since the external terminal electrodes 14 are not disposed at the corners, the external terminal electrodes 14 do not receive the concentrated stress at the corners. Consequently, disconnection of the external terminal electrodes 14 does not occur at the corners, which improves impact resistance. The concentrated stress primarily influences the flat corners of the leg portion 15 at which the external terminal electrodes 14 are disposed. Therefore, as shown in FIG. 9B, the concentration of the stress at the corners is prevented by lowering the corners in the direction of the composite resin layer 18 so that the height of the corners is lower than the bottom surface of the leg portion 15 at which the external terminal electrodes 14 are disposed. Thus, the impact resistance is further improved.

Even if the external terminal electrodes 14 are not disposed at the corners of the rectangular frame-shaped leg portion 15, or the height of the corners is not lowered, the external terminal electrodes 14 still receive impact forces as long as the composite ceramic substrate is mounted on the mount board. As show in FIG. 10, the bonding strength with the mount board is improved by elongating the external terminal electrodes 14 from the bottom surface to the outside surface of the leg portion 15 and not only bonding the bottom surfaces of the external terminal electrodes 14, but also forming fillets such as solder on the side surfaces of the external terminal electrodes 14. Thus, the impact resistance is further improved.

Seventh Preferred Embodiment

Figure 11:
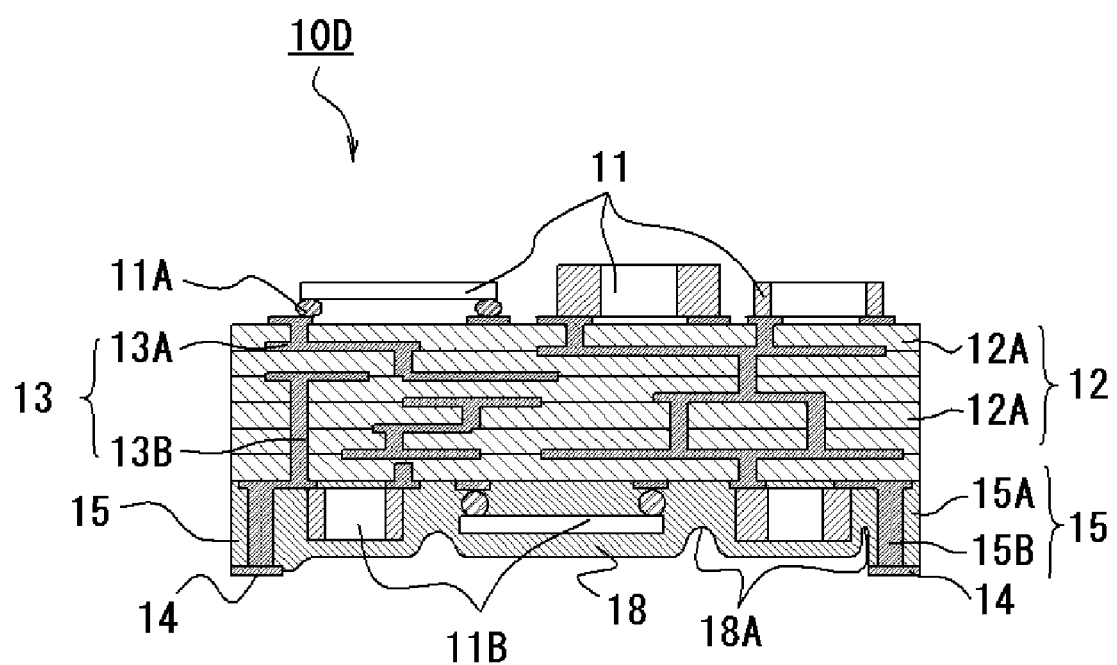
FIG. 11 is a cross-sectional view of a composite ceramic substrate according to another preferred embodiment of the present invention.

In a composite ceramic substrate 10D of this preferred embodiment, for example, as shown in FIG. 11, the surface-mounted components 11B are mounted on the bottom surface of the multilayer ceramic substrate 12 of the third preferred embodiment and the composite resin layer 18 formed as in the fourth preferred embodiment includes slits 18A. The slits 18A are formed so as to partition the plurality of surface-mounted components 11B into individual devices. The slits 18A can be formed, for example, by cold isostatic pressing when the composite resin layer 18 and the leg portions 15 in the fourth preferred embodiment are formed by press-forming. With this, the slits 18A can be formed into shapes tracing the concave and convex portions of the surface-mounted components 11B.

Therefore, according to this preferred embodiment, by forming the slits 18A corresponding to the shapes of the respective surface-mounted components 11B, the composite resin layer 18 having a thickness greater than a certain value is formed at the outside of the surface-mounted components 11B. As a result, the surface-mounted components 11B are prevented from protruding from the composite resin layer 18. Thus, the surface-mounted components 11B are reliably protected.

Eighth Preferred Embodiment

Figure 12:
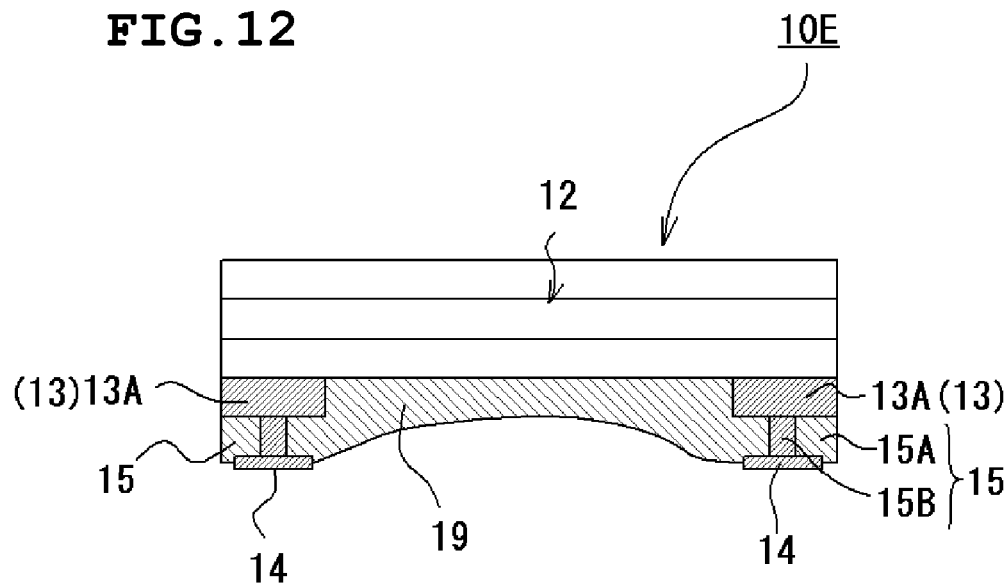
FIG. 12 is a cross-sectional view of a composite ceramic substrate according to another preferred embodiment of the present invention.

In a composite ceramic substrate 10E of this preferred embodiment, for example, as shown in FIG. 12, a composite resin layer 19 has a thickness that progressively increases from the central portion of the composite resin layer 19 toward the plurality of external terminal electrodes 14 to form a plurality of leg portions 15 at the periphery. In other words, the surface electrodes 13A disposed on the bottom surface of the multilayer ceramic substrate 12 have a greater thickness than that of the in-plane conductors disposed in the inside of the multilayer ceramic substrate 12. Thus, a recess which smoothly curves toward the central portion of the composite resin layer 19 is formed. That is, in this preferred embodiment, the surface-mounted components are not built in the composite resin layer 19, but they may be built in the composite resin layer 19. In FIG. 12, wiring patterns of the multilayer ceramic substrate 12 are omitted.

Therefore, according to this preferred embodiment, the same functions and advantageous effects as the first preferred embodiment are achieved. More specifically, the composite resin layer 19 is not flat, and consequently, even if the motherboard is bent to come into contact with the composite ceramic substrate 10E, the contact occurs at a plurality of points to disperse the force. Thus, cracking at the contacting points is prevented.

Ninth Preferred Embodiment

Figure 13:
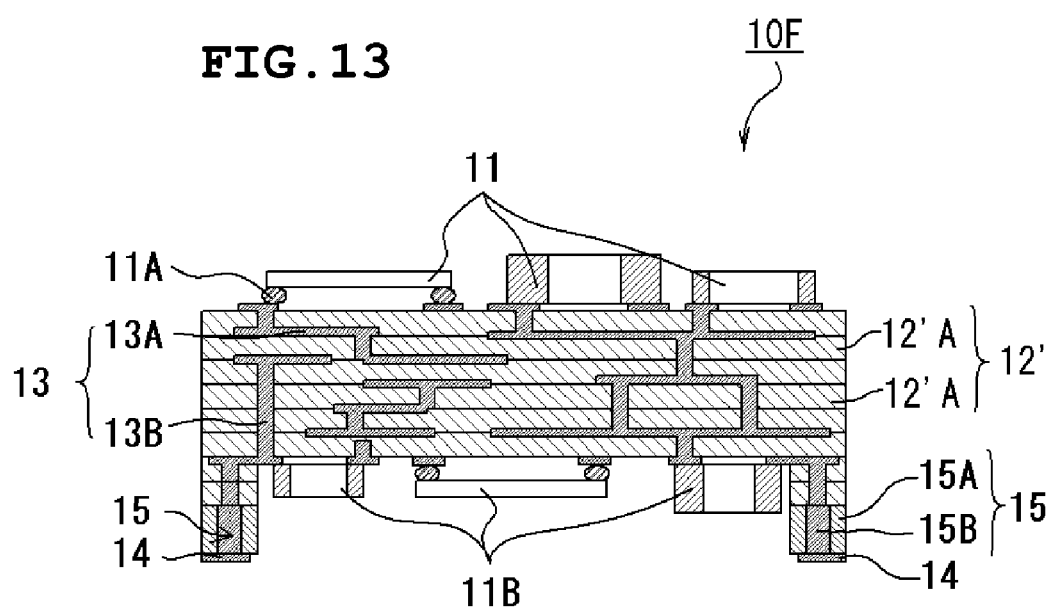
FIG. 13 is a cross-sectional view of a composite ceramic substrate having a cavity-type multilayer ceramic substrate according to another preferred embodiment of the present invention.

A composite ceramic substrate 10F of this preferred embodiment is, for example, as shown in FIG. 13, similar to the first preferred embodiment except that the multilayer ceramic substrate 12' has a cavity C. The cavity C is formed, for example, by preparing a required number of ceramic green sheets (two sheets in the drawing) having a through-hole defining the cavity C when the multilayer ceramic substrate 12' is prepared. Then, the ceramic green sheets having the through-hole are provided with via-hole conductors and in-plane conductors and are laminated to the other ceramic green sheets which do not include the through-hole. Thus, a ceramic green laminate is prepared. The multilayer ceramic substrate 12' having a cavity can be prepared by sintering this ceramic green laminate. Then, the leg portions 15 are attached as in the first preferred embodiment. According to this preferred embodiment, the height of the composite ceramic substrate is further decreased by mounting the surface-mounted components 11B in the cavity C.

Tenth Preferred Embodiment

Figure 14:
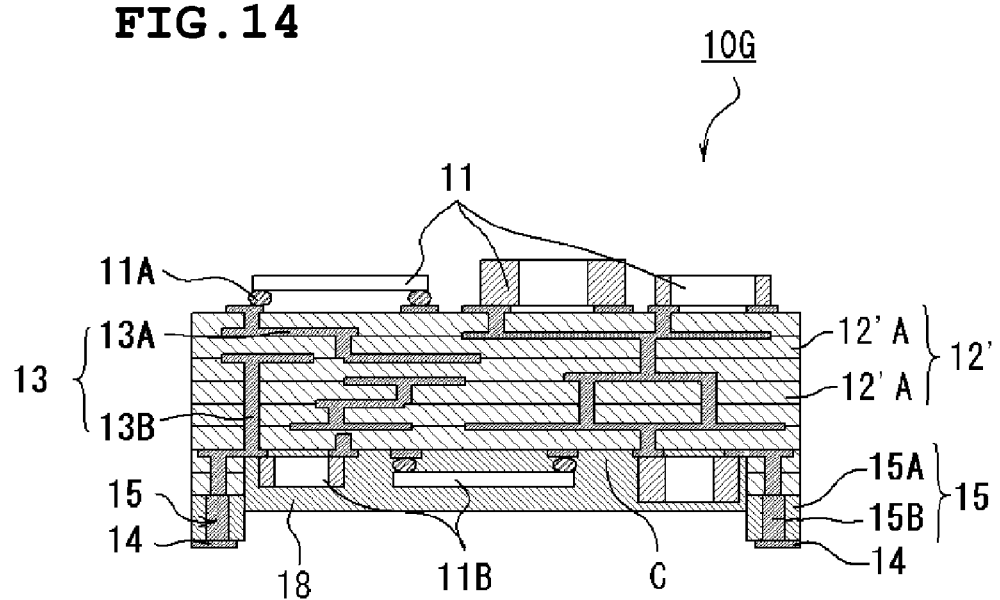
FIG. 14 is a cross-sectional view of a composite ceramic substrate having a cavity-type multilayer ceramic substrate according to another preferred embodiment of the present invention.

A composite ceramic substrate 10G of this preferred embodiment is, for example, as shown in FIG. 14, similar to the seventh preferred embodiment shown in FIG. 11 except that the multilayer ceramic substrate 12' has the cavity C. The cavity C is formed as in the ninth preferred embodiment. In this preferred embodiment, the slits 18A shown in FIG. 11 are not formed in the bottom surface of the composite resin layer 18. However, the slits 18A shown in FIG. 11 may be formed in this preferred embodiment. According to this preferred embodiment, in comparison with the composite ceramic substrate 11D shown in FIG. 11, the height of the composite ceramic substrate 11G can be further decreased by mounting the surface-mounted components 11B in the cavity C. In this case, as shown in FIG. 14, the height of the surface-mounted components 11B disposed in the cavity C may be greater than the depth of the cavity C. In other words, although a deep cavity is difficult to form, a decrease in the height can be achieved even if the depth of the cavity is not sufficiently large to completely embed the surface-mounted components 11B.

Eleventh Preferred Embodiment

Figure 15:
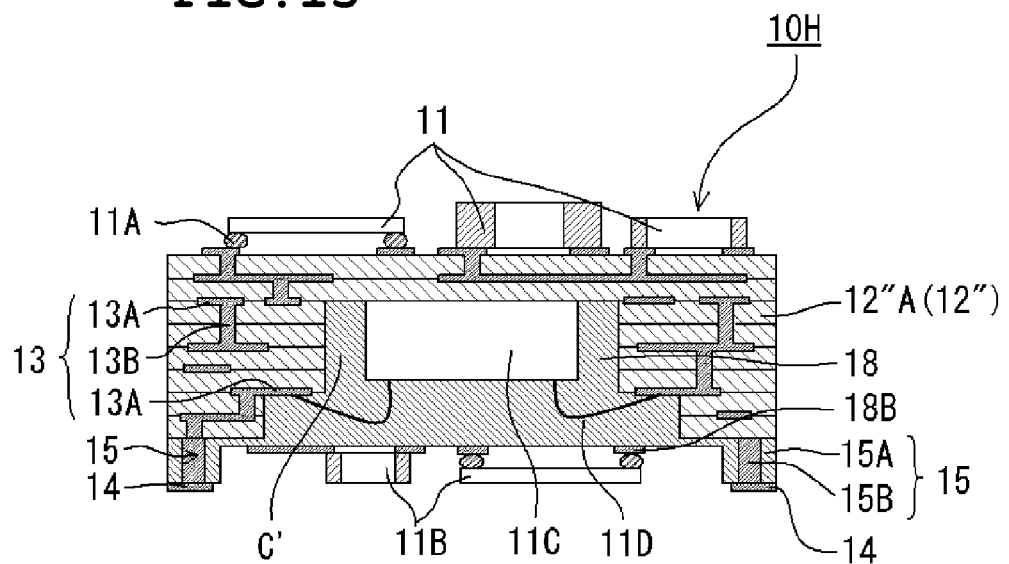
FIG. 15 is a cross-sectional view of a composite ceramic substrate having a cavity-type multilayer ceramic substrate according to another preferred embodiment of the present invention.

In a composite ceramic substrate 10H of this preferred embodiment, for example, as shown in FIG. 15, a multilayer ceramic substrate 12" has a two-stage cavity C' and surface-mounted component 11C including an active component, such as a semiconductor, is mounted on the base of the cavity C'. The multilayer ceramic substrate 12" having the two-stage cavity C' can be formed by preparing two types of ceramic green sheets having different sized through-holes at central portions thereof, laminating as many pieces of each of the ceramic green sheets as required, laminating the ceramic green sheets having the through-hole to the ceramic green sheets not having the through-hole, and sintering the laminate. As shown in FIG. 15, the surface-mounted component 11C is connected to the surface electrodes 13A, of which terminal electrodes are formed on the inside stage planes, via bonding wires 11D. The composite resin layer 18 is formed in the cavity C' so as to seal the surface-mounted component 11C. The leg portions 15 are formed at the periphery of the bottom surface of the composite resin layer 18, and surface electrodes 18B are formed in a predetermined pattern on the inside of the leg portions. With respect to the leg portions 15, various shapes described in the above-mentioned preferred embodiments may be used depending on the requirements. The surface-mounted components 11B are mounted on the bottom surface of the composite resin layer 18 and are connected to the wiring pattern 13 of the multilayer ceramic substrate 12 via the surface electrodes 18B.

Therefore, according to this preferred embodiment, the surface-mounted component 11C is mounted on the base of the cavity C' and the other surface-mounted components 11B are mounted on the bottom surface of the composite resin layer 18 sealing the surface-mounted component 11C. Consequently, higher-density mounting of the surface-mounted components is achieved. Thus, further functional capabilities are realized.

The present invention can be applied to composite ceramic substrates including surface-mounted components that are mounted thereon, such as semiconductors and passive components such as capacitors.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A composite ceramic substrate comprising:
a ceramic substrate including a surface-mounted component mounted thereon;
at least one wiring pattern disposed in the ceramic substrate;
a plurality of external terminal electrodes connecting the at least one wiring pattern to a surface electrode of a motherboard;
a plurality of convex leg portions made of resin and arranged on the ceramic substrate such that a first end surface of each of the plurality of convex leg portions supports a respective one of the plurality of external terminal electrodes and a second end surface of each of the plurality of convex leg portions opposite to the first end surface is in direct contact with and directly connected to the ceramic substrate; and
a via-hole conductor provided in each of the plurality of convex leg portions and connecting the respective one of the plurality of external terminal electrodes to the at least one wiring pattern; wherein
the plurality of convex leg portions are arranged so as to be spaced apart from one another.

2. The composite ceramic substrate according to claim 1, wherein the surface-mounted component is mounted on at least one of a first main surface and a second main surface of the ceramic substrate and the plurality of convex leg portions are disposed on the second main surface of the ceramic substrate.

3. The composite ceramic substrate according to claim 2, wherein the surface-mounted component is mounted between the plurality of convex leg portions on the second main surface.

4. The composite ceramic substrate according to claim 3, wherein the surface-mounted component is coated with resin that is the same as the resin from which the plurality of convex leg portions are made.

5. The composite ceramic substrate according to claim 4, wherein a round portion is provided between the plurality of convex leg portions and the resin coating the surface-mounted component.

6. The composite ceramic substrate according to claim 4, wherein a surface of the resin coating the surface-mounted component includes a slit.

7. The composite ceramic substrate according to claim 2, wherein the plurality of convex leg portions are disposed at a periphery of the second main surface of the ceramic substrate.

8. The composite ceramic substrate according to claim 1, wherein none of the plurality of external terminal electrodes are disposed at corners of the second main surface of the ceramic substrate.

9. The composite ceramic substrate according to claim 8, wherein the corners are disposed at a height that is lower than a height at which the external terminal electrodes are disposed.

10. The composite ceramic substrate according to claim 1, wherein an edge of each of the plurality of convex leg portions has a rounded shape.

11. The composite ceramic substrate according to claim 1, wherein the via-hole conductor is made of a flexible conductive resin.

12. The composite ceramic substrate according to claim 1, wherein the ceramic substrate is a multilayer ceramic substrate including a plurality of laminated low temperature co-fired ceramic layers.

13. The composite ceramic substrate according to claim 1, wherein the surface-mounted component includes an array of external terminal electrodes.

* * * * *